United States Patent
Kumagae et al.

(10) Patent No.: US 11,195,661 B2
(45) Date of Patent: Dec. 7, 2021

(54) ETCHING MANUFACTURING METHOD OF THIN FILM CAPACITOR

(71) Applicant: TDK Corporation, Tokyo (JP)

(72) Inventors: Michihiro Kumagae, Tokyo (JP); Kazuhiro Yoshikawa, Tokyo (JP); Kenichi Yoshida, Tokyo (JP); Junki Nakamoto, Tokyo (JP); Norihiko Matsuzaka, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 16/294,139

(22) Filed: Mar. 6, 2019

(65) Prior Publication Data
US 2019/0279823 A1   Sep. 12, 2019

(30) Foreign Application Priority Data
Mar. 9, 2018   (JP) .............................. JP2018-043397

(51) Int. Cl.
*H01G 4/30* (2006.01)
*H01G 4/33* (2006.01)
(Continued)

(52) U.S. Cl.
CPC ............. *H01G 4/306* (2013.01); *H01G 4/012* (2013.01); *H01G 4/33* (2013.01); *H01G 4/008* (2013.01);
(Continued)

(58) Field of Classification Search
CPC .......... H01G 4/306; H01G 4/33; H01G 4/012; H01G 4/008; H01G 4/1218; H01G 4/1227; H01G 4/1245; H01G 4/2325
See application file for complete search history.

(56) References Cited

U.S. PATENT DOCUMENTS

2002/0113239 A1* 8/2002 Uochi ............... H01L 29/66757
                                                                257/72
2006/0091107 A1* 5/2006 Li ..................... H01L 21/31116
                                                                216/58

(Continued)

FOREIGN PATENT DOCUMENTS

| JP | 2008-153497 A |   | 7/2008 |   |
|---|---|---|---|---|
| JP | 2015070058 A | * | 4/2015 | ............. H01G 4/12 |
| WO | WO-2009/078225 A1 |   | 6/2009 |   |

*Primary Examiner* — Peter Dungba Vo
*Assistant Examiner* — Jeffrey T Carley
(74) *Attorney, Agent, or Firm* — Faegre Drinker Biddle & Reath LLP

(57) ABSTRACT

Provided is a manufacturing method of a thin film capacitor comprising a capacitance portion in which at least one dielectric layer is sandwiched between a pair of electrode layers included in a plurality of electrode layers, the manufacturing method including a lamination process of alternately laminating the plurality of electrode layers and a dielectric film and forming a laminated body which will be the capacitance portion, a first etching process of forming an opening extending in a laminating direction with respect to the laminated body and exposing the dielectric film laminated directly on one of the plurality of electrode layers on a bottom surface of the opening, and a second etching process of exposing the one electrode layer at the bottom surface of the opening. In the second etching process, an etching rate of the one electrode layer is lower than an etching rate of the dielectric film.

3 Claims, 4 Drawing Sheets

(51) Int. Cl.
*H01G 4/012* (2006.01)
*H01G 4/232* (2006.01)
*H01G 4/12* (2006.01)
*H01G 4/008* (2006.01)

(52) U.S. Cl.
CPC ......... *H01G 4/1218* (2013.01); *H01G 4/1227* (2013.01); *H01G 4/1245* (2013.01); *H01G 4/2325* (2013.01)

(56) References Cited

U.S. PATENT DOCUMENTS

| | | | |
|---|---|---|---|
| 2008/0137263 A1* | 6/2008 | Min | H05K 1/162 361/311 |
| 2008/0145996 A1 | 6/2008 | Nomura et al. | |
| 2010/0252527 A1* | 10/2010 | Takeshima | H01L 28/91 216/13 |
| 2013/0065023 A1 | 3/2013 | Ali et al. | |
| 2017/0338042 A1 | 11/2017 | Shin et al. | |
| 2018/0102219 A1* | 4/2018 | Kumagae | H01G 4/224 |

\* cited by examiner

ETCHING MANUFACTURING METHOD OF THIN FILM CAPACITOR

TECHNICAL FIELD

The present invention relates to a manufacturing method of a thin film capacitor and a thin film capacitor.

BACKGROUND

Conventionally, a thin film capacitor having a capacitance portion in which a plurality of electrode layers and dielectric layers are alternately laminated is known. For example, in PCT International Publication No. WO2009/078225, a manufacturing method of a thin film capacitor which includes forming a capacitance portion by alternately laminating an electrode layer and a dielectric layer, and forming a through hole in a capacitance portion by etching to expose the electrode layer electrically connected to an external electrode is disclosed as a manufacturing method of such a thin film capacitor.

SUMMARY

However, when the electrode layer (an electrode layer which becomes one pole of the thin film capacitor) electrically connected to the external electrode is exposed by etching, it is difficult to stop the etching at the timing when the electrode layer is exposed. Therefore, the electrode layer may be excessively etched and strength of the electrode layer may be lowered.

The present invention has been made in view of the above problem, and an object thereof is to provide a manufacturing method of a thin film capacitor with which a decrease in strength of an electrode layer is able to be curtailed, and a thin film capacitor in which a decrease in strength of an electrode layer is able to be curtailed.

According to one embodiment of the present invention, there is provided a manufacturing method of a thin film capacitor comprising a capacitance portion in which at least one dielectric layer is sandwiched between a pair of electrode layers included in a plurality of electrode layers, the manufacturing method including a lamination process of alternately laminating the plurality of electrode layers and a dielectric film which will be the dielectric layer and forming a laminated body which will be the capacitance portion, a first etching process of forming an opening extending in a laminating direction with respect to the laminated body and exposing the dielectric film laminated directly on one of the plurality of electrode layers on a bottom surface of the opening, and a second etching process of exposing the one electrode layer at the bottom surface of the opening, wherein an etching rate of the one electrode layer is lower than an etching rate of the dielectric film in the second etching process.

This manufacturing method of the thin film capacitor includes the first etching process of performing etching until the dielectric film laminated just above one of the plurality of electrode layers is exposed, and the second etching process of exposing one electrode layer, and the etching rate of the one electrode layer is lower than the etching rate of the dielectric film in the second etching process. Therefore, since the target electrode layer can be exposed under a condition that it is difficult for the electrode layer to be etched and thus the target electrode layer can be exposed under a condition that an etching rate of the electrode layer is low, excess etching of the one electrode layer of the thin film capacitor is able to be prevented. Therefore, it is possible to suppress a decrease in strength of the electrode layer.

In one embodiment, the etching rate of the one electrode layer in the second etching process may be lower than the etching rate of the plurality of electrode layers in the first etching process. With such a configuration, since the target electrode layer can be exposed under a condition that the etching rate of the electrode layer is low, excess etching of the one electrode layer of the thin film capacitor is able to be prevented. Therefore, it is possible to suppress a decrease in the strength of the electrode layer.

According to one embodiment of the present invention, there is provided a thin film capacitor including a capacitance portion in which at least one dielectric layer is sandwiched between a pair of electrode layers included in a plurality of electrode layers, wherein the capacitance portion has an opening which extends in a lamination direction in which the plurality of electrode layers and the dielectric layer are laminated and through which one electrode layer of the plurality of electrode layers is exposed, the one electrode layer has an exposed portion exposed at a bottom surface of the opening, and a thickness of the exposed portion is smaller than a thickness of the other portions of the one electrode layer and is 50% or more of the thickness of the other portions of the one electrode layer.

One electrode layer of the thin film capacitor has the exposed portion exposed at the bottom surface of the opening, the thickness of the exposed portion is smaller than the thickness of the other portions of the one electrode layer and is 50% or more of the thickness of the other portions of the one electrode layer. That is, since an amount of the etched electrode layer is 50% or less of the thickness, excessive etching of the one electrode layer of the thin film capacitor is suppressed. Thus, a decrease in the strength of the electrode layer is suppressed.

According to the present invention, there are provided a manufacturing method of a thin film capacitor with which a decrease in strength of an electrode layer is able to be curtailed, and a thin film capacitor in which a decrease in strength of an electrode layer is able to be curtailed.

DETAILED DESCRIPTION

Figure 1:
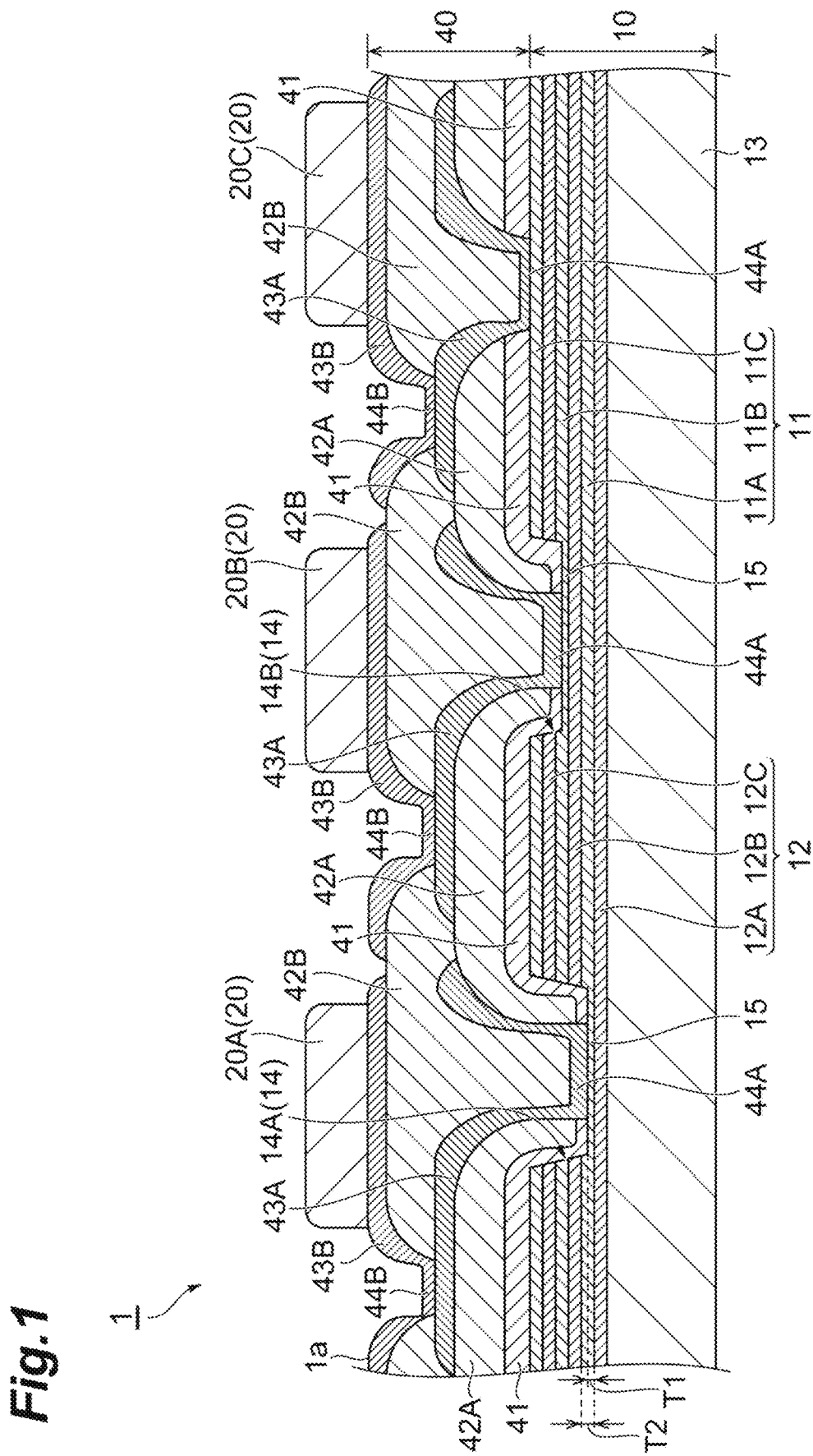
FIG. 1 is a cross-sectional view schematically showing a part of a thin film capacitor according to an embodiment of the present invention.

Hereinafter, various embodiments will be described in detail with reference to the drawings. In each drawing, the same or corresponding portions are designated by the same reference numerals, and duplicate explanation will be omitted.

FIG. 1 is a cross-sectional view schematically showing a part of a thin film capacitor according to an embodiment of the present invention. As shown in FIG. 1, the thin film capacitor 1 has a capacitance portion 10 as a capacitor structure therein in which at least one dielectric layer is sandwiched between a pair of electrode layers. Electrode terminals 20 (20A, 20B and 20C) are drawn as electrode terminals from the capacitance portion 10. A wiring portion 40 which electrically connects the capacitance portion 10 to the electrode terminals 20 is provided between the capacitance portion 10 and the electrode terminals 20.

In the specification, a "laminating direction" is a direction in which layers, such as the capacitance portion 10, the wiring portion 40 and the electrode terminals 20, sequentially overlap from the capacitance portion 10 toward the electrode terminals 20. Further, in the following description, the side of the electrode terminal 20 may be referred to as "the upper side" in the laminating direction, and the side of the capacitance portion 10 may be referred to as "downward" in the laminating direction.

The capacitance portion 10 includes a plurality of internal electrode layers (electrode layers) 11 provided in the laminating direction, a dielectric layer 12 sandwiched between the internal electrode layers 11, and a base electrode layer (the electrode layer) 13 on which the plurality of internal electrode layers and the dielectric layer 12 are laminated. The internal electrode layers 11 and the dielectric layer 12 are alternately laminated on the base electrode layer 13. In the embodiment, the capacitance portion 10 has a multilayer structure including three internal electrode layers 11 (11A, 11B and 11C), three dielectric layers 12 (12A, 12B and 12C), and one base electrode layer 13. Respective layers of the capacitance portion 10 are laminated in the order of the base electrode layer 13, the dielectric layer 12A, the internal electrode layer 11A, the dielectric layer 12B, the internal electrode layer 11B, the dielectric layer 12C, and the internal electrode layer 11C from the lower side in the laminating direction. In the following description, the internal electrode layer 11 and the base electrode layer 13 may be collectively referred to as an "electrode layer."

The capacitance portion 10 has a plurality of regions in which each of the internal electrode layers 11 and the dielectric layers 12 is partially removed. Therefore, an opening 14 extending in the laminating direction in which the internal electrode layers 11 and the dielectric layers 12 are laminated is formed in the capacitance portion 10. The opening 14 passes through at least one internal electrode layer 11 and one dielectric layer 12. In the opening 14, one of the plurality of internal electrode layers 11 or the base electrode layer 13 is exposed at a bottom surface of the opening 14. In FIG. 1, two openings 14 (openings 14A and 14B) are shown, the internal electrode layer 11A being exposed in one opening 14A, and the internal electrode layer 11B being exposed in the other opening 14B. The internal electrode layers 11A and 11B have exposed portions 15 exposed at the bottom surfaces of the openings 14A and 14B, and each of the exposed portions 15 is connected to a first wiring layer 43A which will be described later. With such a structure, a multilayer capacitor structure is formed in the capacitance portion 10. A thickness T1 of the exposed portions 15 of the internal electrode layers 11A and 11B is thinner than a thickness T2 of other portions (that is, portions not exposed from the opening 14) of the internal electrode layers 11A and 11B and is 50% or more of the thickness T2 of the other portions of the internal electrode layers 11A and 11B. Although omitted in FIG. 1, like the internal electrode layer 11, the base electrode layer 13 also has an exposed portion which is exposed at the bottom surface of the opening 14 and connected to the first wiring layer 43A.

The internal electrode layer 11 is formed of a material having conductivity. Specifically, a material containing nickel (Ni) or platinum (Pt) as a main component (a component having the largest content) is suitably used for the internal electrode layer 11, and Ni is particularly preferably used. When a material containing Ni as a main component is used for the internal electrode layer 11, its content is preferably 50% by mass or more with respect to the entire internal electrode layer 11. Also, when the main component of the internal electrode layer 11 is Ni, at least one element (hereinafter, referred to as an "additional element") selected from a group consisting of platinum (Pt), palladium (Pd), iridium (Ir), rhodium (Rh), ruthenium (Ru), osmium (Os), rhenium (Re), tungsten (W), chromium (Cr), tantalum (Ta), and silver (Ag) is further contained. When the internal electrode layer 11 contains an additional element, disconnection of the internal electrode layer 11 can be inhibited. The internal electrode layer 11 may contain a plurality of additional elements. A thickness of the internal electrode layer 11 is, for example, about 10 nm to 1000 nm. Further, the base electrode layer 13 can be formed of the same conductive material as that of the internal electrode layer 11. A thickness of the base electrode layer 13 can be, for example, 5 µm or more and 50 µm or less.

The dielectric layer 12 is formed of a perovskite-based dielectric material. The perovskite-based dielectric material in the embodiment includes a dielectric (ferroelectric) material having a perovskite structure such as $BaTiO_3$ (barium titanate), $(Ba_{1-x}Sr_x)TiO_3$ (barium strontium titanate), $(Ba_{1-x}Ca_x)TiO_3$, $PbTiO_3$, $Pb(Zr_xTi_{1-x})O_3$ or the like, a complex perovskite relaxor type ferroelectric material represented by $Pb(Mg_{1/3}Nb_{2/3})O_3$ or the like, a bismuth layered compound represented by $Bi_4Ti_3O_{12}$, $SrBi_2Ta_2O_9$ or the like, a tungsten bronze type ferroelectric material or the like represented by $(Sr_{1-x}Ba_x)Nb_2O_6$, $PbNb_2O_6$ or the like. Here, in the perovskite structure, the perovskite relaxor type ferroelectric material, the bismuth layered compound, and the tungsten bronze type ferroelectric material, a ratio between A sites and B sites is usually an integer ratio, but there may be intentional deviation from an integer ratio to improve characteristics. The dielectric layer 12 may appropriately contain an additive as an accessary component to control the characteristics of the dielectric layer 12. The dielectric layer 12 is baked, and a relative dielectric constant (Er) thereof is, for example, 100 or more. The relative dielectric constant of the dielectric layer 12 is preferably as large as possible, and an upper limit value thereof is not particularly limited. A thickness of the dielectric layer 12 is, for example, 10 nm to 1000 nm.

A electrode terminal 20 is a terminal for electrically connecting the thin film capacitor 1 with an external electronic component, a wiring substrate or the like (not shown). The electrode terminal 20 is laminated on the wiring portion 40 which will be described later. In the embodiment, the thin film capacitor 1 has a plurality of electrode terminals 20. In FIG. 1, only three electrode terminals 20A, 20B and 20C are shown.

In the material constituting the electrode terminal 20, nickel (Ni), copper (Cu), gold (Au), platinum (Pt), and an alloy containing these metals as a main component are preferable, and in particular, an alloy containing Cu as a main component is preferably used. The higher the purity of Cu constituting the electrode terminal 20 is, the better it is, and it is preferably 99.99% by weight or more. A small amount of impurities may be contained in the electrode terminal 20. Examples of impurities which can be contained in the electrode terminal 20 formed of an alloy containing Cu as a main component include transition metal elements such as iron (Fe), titanium (Ti), nickel (Ni), aluminum (Al), magnesium (Mg), manganese (Mn), silicon (Si) or chromium (Cr), vanadium (V), zinc (Zn), niobium (Nb), tantalum (Ta) yttrium (Y), lanthanum (La), cesium (Ce), or the like, or rare earth elements, chlorine (Cl), sulfur (S), phosphorus (P), and so on.

The wiring portion 40 is provided to cover a region in which the capacitance portion 10 is formed, and includes a passivation layer 41, a first insulating layer 42A, a second insulating layer 42B, a first wiring layer 43A, and a second wiring layer 43B. The first insulating layer 42A and the second insulating layer 42B serve as insulating layers on the capacitance portion 10. The first wiring layer 43A and the second wiring layer 43B are wiring layers in the wiring portion 40.

The passivation layer 41 directly covers the capacitance portion 10 and is formed of, for example, an inorganic insulating material such as silicon oxide (SiO) or the like. The passivation layer 41 may be a layer formed of a single inorganic insulating material or may be a laminated structure formed of a plurality of inorganic insulating materials. However, the passivation layer 41 may not be provided. A thickness of the passivation layer 41 can be, for example, about 0.5 µm or more and 5 µm or less.

The first insulating layer 42A covers the capacitance portion 10 in each region in which the capacitor is formed in the capacitance portion 10. The second insulating layer 42B covers a region in which the first insulating layer 42A is not formed and partially covers a periphery of the first insulating layer 42A. That is, the capacitance portion 10 is covered with a two-stage structure of the first insulating layer 42A and the second insulating layer 42B.

The first insulating layer 42A and the second insulating layer 42B are not particularly limited as long as they have insulating properties, and for example, a nonconductive resin such as polyimide, an inorganic material such as silicon oxide (SiO), alumina ($Al_2O_3$), and silicon nitride (SiN), or an insulating material obtained by mixing or laminating these can be used. A thickness of the first insulating layer 42A is, for example, 0.5 µm or more and 10 µm or less, and a thickness of the second insulating layer 42B is, for example, 0.5 µm or more and 10 µm or less. Here, the "thickness of the first insulating layer 42A" is a distance between an upper surface of the passivation layer 41 and an upper surface of the first insulating layer 42A. Further, the "thickness of the second insulating layer 42B" is a distance between the upper surface of the first insulating layer 42A and an upper surface of the second insulating layer 42B.

The first wiring layer 43A is formed along the upper surface of the first insulating layer 42 between the first insulating layer 42A and the second insulating layer 42B. The first wiring layer 43A extends in a vertical direction along the upper surface of the first insulating layer 42A and has a contact portion 44A, which is in contact with the exposed portion 15 of the internal electrode layer 11, at a lower end thereof. Also, the second wiring layer 43B is formed on the second insulating layer 42B along the upper surface of the second insulating layer 42B. The second wiring layer 43B extends in the vertical direction along the second insulating layer 42B and has a contact portion 44B, which is in contact with the first wiring layer 43A, at a lower end thereof. The electrode terminals 20A, 20B and 20C are formed on the second wiring layer 43B.

The contact portion 44B of the second wiring layer 43B on which the electrode terminal 20A is formed is in contact with the first wiring layer 43A having a contact portion 44A which is in contact with the internal electrode layer 11A located closest to the base electrode layer 13 among the three internal electrode layers 11. The contact portion 44B of the second wiring layer 43B on which the electrode terminal 20B is formed is in contact with the first wiring layer 43A having the contact portion 44A which is in contact with the internal electrode layer 11B located at a center among the three internal electrode layers 11. The contact portion 44B of the second wiring layer 43B on which the electrode terminal 20C is formed is in contact with the first wiring layer 43A having the contact portion 44A which is in contact with the internal electrode layer 11C located closest to the electrode terminal 20 among the three internal electrode layers 11. In this way, the electrode terminals 20A, 20B and 20C are respectively electrically connected to the internal electrode layers 11A, 11B and 11C via the second wiring layer 43B and the first wiring layer 43A.

Next, a manufacturing method of the thin film capacitor 1 will be described with reference to FIGS. 2A to 4B. FIGS. 2A to 4B are views for explaining the manufacturing method of the thin film capacitor shown in FIG. 1. FIGS. 2A to 4B are enlarged views showing a part of the thin film capacitor 1 in the middle of the manufacturing process. Actually, a plurality of thin film capacitors 1 are formed at one time, and then they are segmented into individual thin film capacitors 1. In the following embodiment, a case in which the dielectric layer 12 is formed by baking will be described, but the dielectric layer 12 may be formed without baking.

Figure 2A:
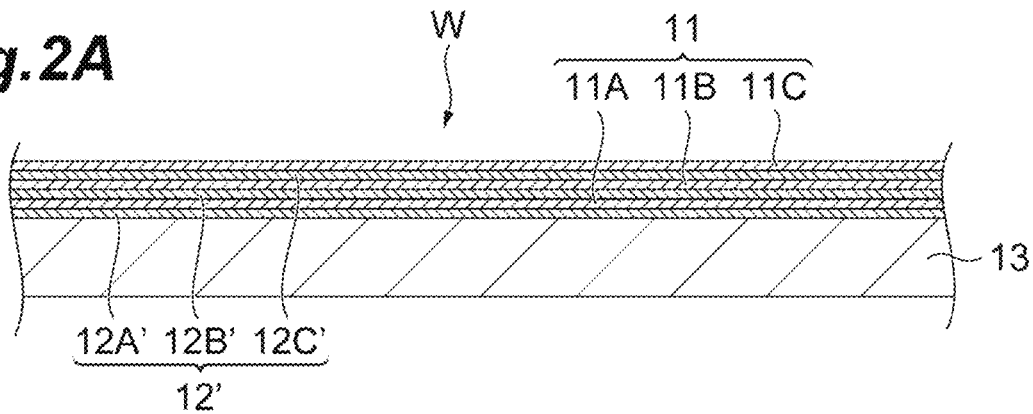
FIGS. 2A, 2B, 2C are views for explaining a method of manufacturing the thin film capacitor of FIG. 1.

First, as shown in FIG. 2A, the base electrode layer 13 is prepared, and a laminated body W is formed by alternately laminating the internal electrode layers 11 (11A, 11B and 11C) and the dielectric films 12' (dielectric films 12A', 12B' and 12C') which will be the dielectric layers 12 (12A, 12B and 12C) on the base electrode layer 13 (a lamination process). Due to this process, in the laminated body W, the base electrode layer 13, the dielectric film 12A', the internal electrode layer 11A, the dielectric film 12B', the internal electrode layer 11B, the dielectric film 12C', and the internal electrode layer 11C are laminated in this order from the lower side in the laminating direction, and a portion which will be the capacitance portion 10 is formed. For example, DC sputtering or the like can be used as a method of forming the internal electrode layer 11. Also, as a method of forming the dielectric film 12', a film forming technique such as a solution method, a physical vapor deposition (PVD) method like sputtering, or a chemical vapor deposition (CVD) method can be used, and for example, the sputtering method may be selected.

Figure 2B:
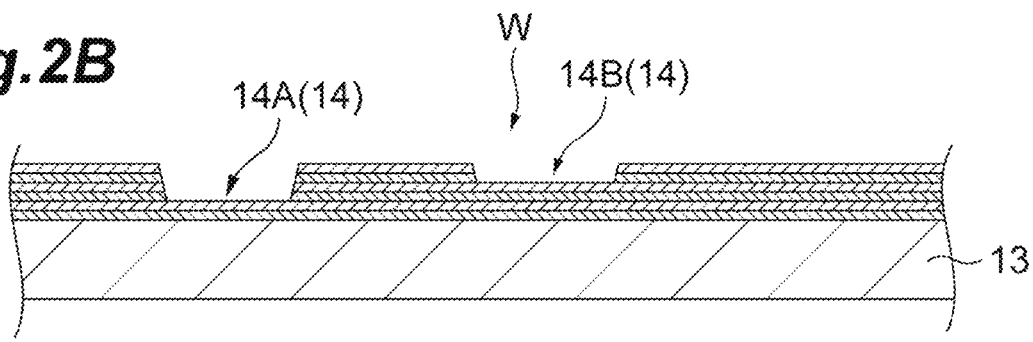

Next, as shown in FIG. 2B, the openings 14 (openings 14A and 14B) are formed in the laminated body W (an etching process). Details of this process will be described later.

Thereafter, the laminated body W is baked. Through this process, the dielectric film 12' is sintered, the dielectric layer 12 is formed, and the capacitance portion 10 (refer to FIG. 2C) is formed. A temperature at the time of baking is preferably a temperature at which the dielectric film 12' is sintered (crystallized), specifically, about 800° C. to 1000° C. being preferable. Further, a baking time can be set to about 5 minutes to 2 hours. An atmosphere at the time of baking is not particularly limited and may be any of an oxidizing atmosphere, a reducing atmosphere and a neutral atmosphere, and it is possible to adopt a constitution in which the baking is performed at least at an oxygen partial pressure which does not oxidize the internal electrode layer 11. A baking timing is not limited, and for example, the baking may be performed before the openings 14 are formed.

Figure 2C:
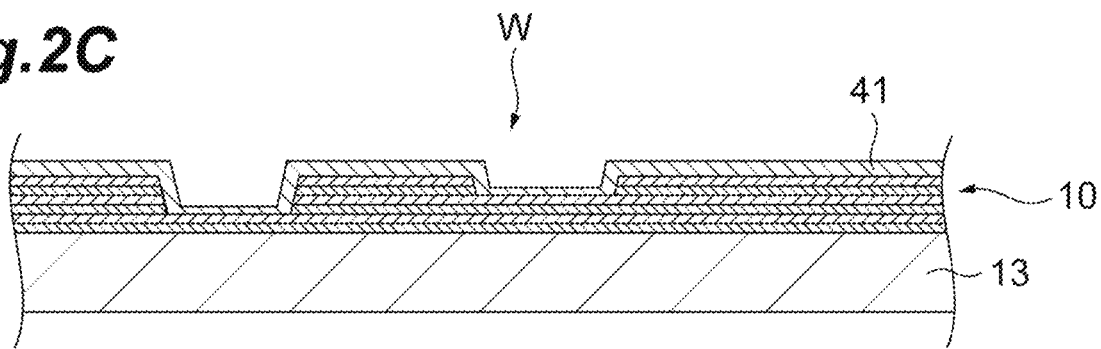

Next, as shown in FIG. 2C, the passivation layer 41 is formed. Thus, an upper surface of the laminated body W, and a bottom surface and a side surface of the opening 14 are covered with the passivation layer 41. The passivation layer 41 can be formed by, for example, the PVD method such as sputtering.

Figure 3A:
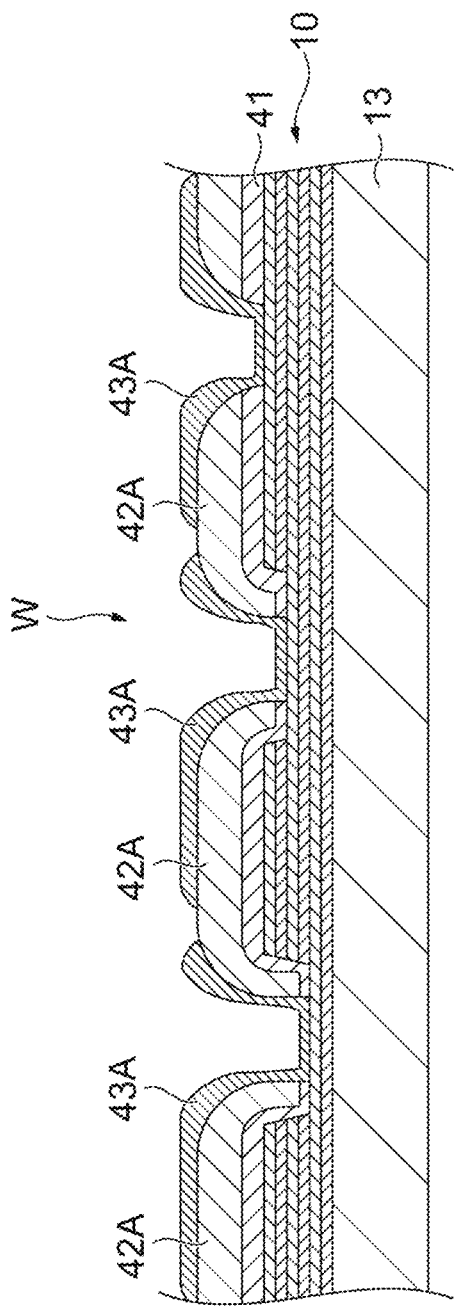
FIGS. 3A, 3B are views for explaining the method of manufacturing the thin film capacitor of FIG. 1.

Next, as shown in FIG. 3A, the first insulating layer 42A is formed to cover the passivation layer 41, and then the passivation layer 41 formed on the bottom surfaces of the openings 14 is removed. Additionally, the first wiring layer 43A is formed on the first insulating layer 42A. The first insulating layer 42A may be formed by, for example, applying a thermosetting resin in an uncured state, curing the applied thermosetting resin by heating or the like and then patterning it. Alternatively, the first insulating layer 42A may be formed by another method such as sputtering or the like. The first wiring layer 43A is formed by sputtering or evaporating a conductive material such as copper (Cu) and then patterning it by etching. Through this process, a plurality of first wiring layers 43A which are electrically independent from each other are formed, and the respective first wiring layers 43A are electrically connected to the respective internal electrode layers 11A, 11B and 11C.

Figure 3B:
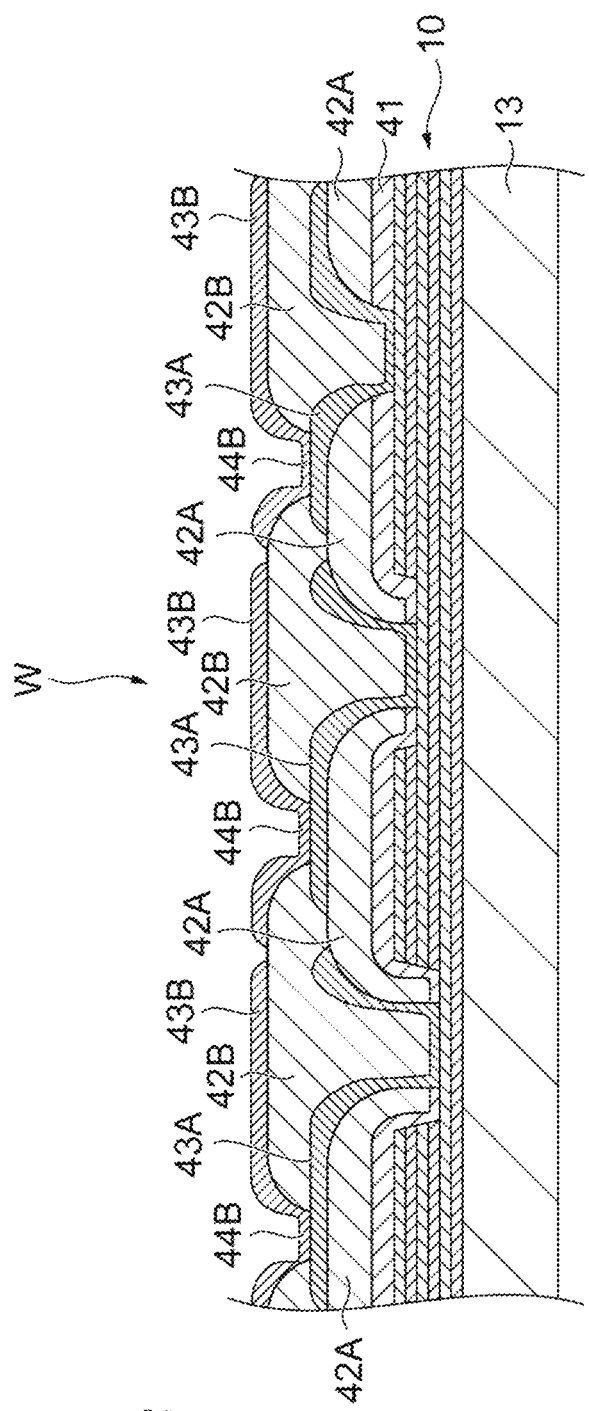

Next, as shown in FIG. 3B, the second insulating layer 42B is formed on the first insulating layer 42A and the first wiring layer 43A. Additionally, the second wiring layer 43B is formed on the second insulating layer 42B. Like the first insulating layer 42A, the second insulating layer 42B is formed by, for example, applying a thermosetting resin in an uncured state, curing the applied thermosetting resin by heating or the like and then patterning it. Like the first wiring layer 43A, the second wiring layer 43B is formed by, for example, sputtering or evaporating a conductive material such as copper (Cu) and then patterning it by etching. Through this process, a plurality of second wiring layers 43B which are electrically independent from each other are formed. The respective second wiring layers 43B are electrically connected to the respective first wiring layers 43A, and the wiring portion 40 is formed.

Thereafter, the electrode terminals 20A, 20B and 20C for electrically connecting the thin film capacitor 1 with external electronic components are formed on the respective second wiring layers 43B. The electrode terminals 20A, 20B and 20C are formed by, for example, forming a layer of a conductive material such as copper (Cu) by plating or the like and then etching it or the like. Eventually, the thin film capacitor 1 shown in FIG. 1 is obtained by segmentation due to dicing or the like.

Next, the etching process will be described in detail with reference to FIGS. 4A and 4B. The etching process includes a first etching process and a second etching process. In the manufacturing method of the thin film capacitor 1, first, the first etching process is performed, and then the second etching process is performed.

Figure 4A:
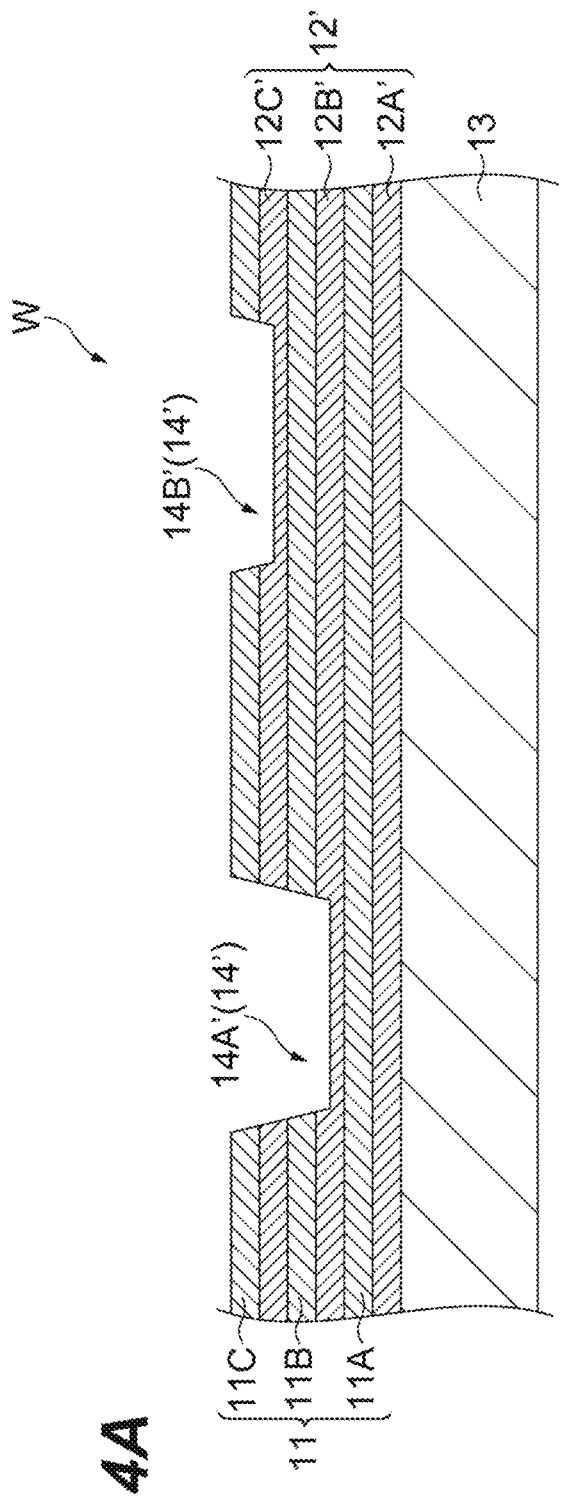
FIGS. 4A, 4B are views for explaining the method of manufacturing the thin film capacitor of FIG. 1.

In the first etching process, as shown in FIG. 4A, an opening 14' extending in the laminating direction is formed in the laminated body W. The dielectric film 12' laminated directly on one of the plurality of electrode layers (the internal electrode layer 11 or the base electrode layer 13) is exposed at a bottom surface of the opening 14'. Specifically, the openings 14A' and 14B' which will later become the openings 14A and 14B are formed. Accordingly, the dielectric film 12B' just above the internal electrode layer 11A is exposed in the opening 14A', and the dielectric film 12C' just above the internal electrode layer 11B is exposed in the opening 14B'. For example, argon (Ar) gas or a mixed gas of Ar and $CHF_3$ can be used as an etching gas used in the first etching process. FIG. 4A shows a state in which the dielectric films 12B' and 12C' are partially etched, but in the first etching process, the etching may be performed until upper surfaces of the dielectric films 12B' and 12C' are exposed.

Figure 4B:
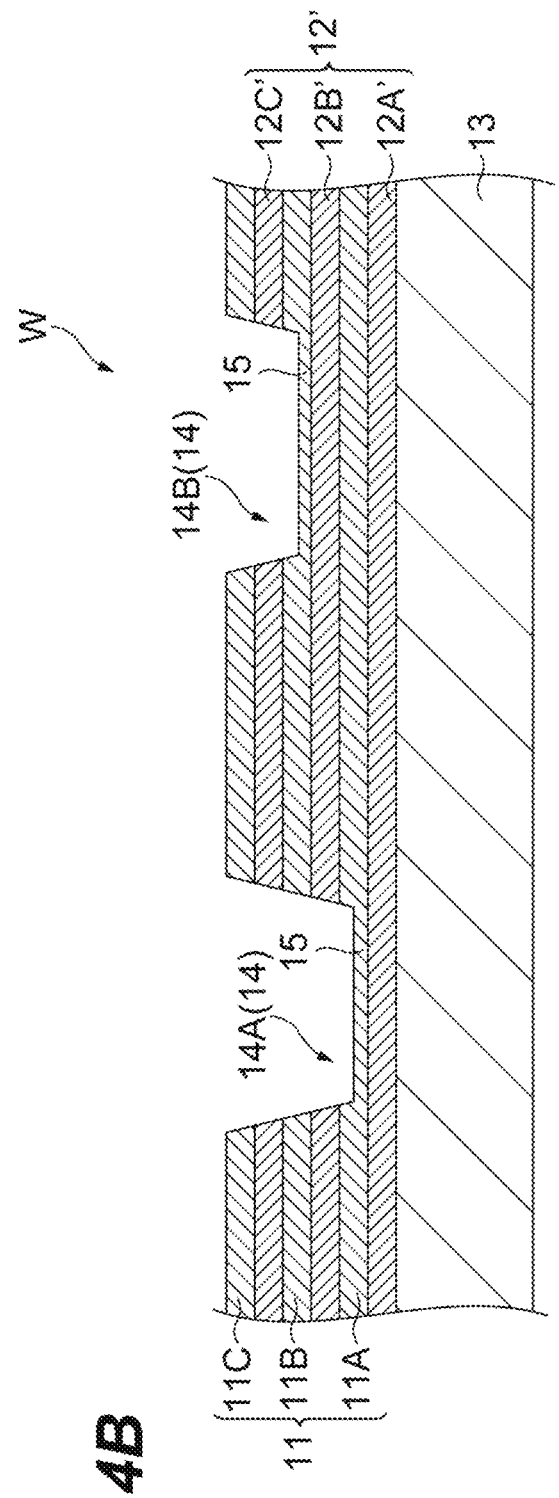

In the second etching process, as shown in FIG. 4B, one target electrode layer (that is, the internal electrode layers 11A and 11B) is exposed at the bottom surface of the opening 14'. Therefore, the openings 14 (the openings 14A and 14B) are formed in the laminate W. Further, the exposed portions 15 are formed in the internal electrode layers 11A and 11B. For example, a mixed gas of Ar and $CHF_3$ can be used as an etching gas used in the second etching process.

An etching rate of one electrode layer (the internal electrode layer 11 or the base electrode layer 13) to be etched in the second etching process is lower than an etching rate of the plurality of electrode layers in the first etching process. As an example, the etching rate of the plurality of electrode layers in the first etching process may be about 30 nm/min or more and about 600 nm/min or less, and the etching rate of the electrode layer in the second etching process may be set to about 5 nm/min or more and about 50 nm/min or less. In addition, in the second etching process, the etching rate of the electrode layer to be etched is lower than the etching rate of the dielectric film 12'. As an example, the etching rate of the electrode layer in the second etching process can be about ¼ of the etching rate of the dielectric film 12' to be etched in the second etching process. The etching rate of the electrode layer in the first etching process may be about 1.5 to 3 times the etching rate of the dielectric film 12' to be etched in the first etching process, but as in the second etching process, the etching rate of the electrode layer may be lower than the etching rate of the dielectric film 12'. The etching rate of the internal electrode layer 11 or the base electrode layer 13 in the first etching process and the second etching process can be adjusted, for example, by changing a type, a flow rate, a mixing ratio or the like of the etching gas. Further, when the first etching process and the second etching process are performed, for example, using a dry etching apparatus such as an ICP-RIE apparatus, the etching rate of the internal electrode layer 11 or the base electrode layer 13 can be adjusted by changing an output for generating plasma from the etching gas and/or an output for drawing the plasma into the laminated body W. For example, when the electrode layer is Ni and the dielectric film is $BaTiO_3$, the etching rate of the electrode layer may be 120 nm/min and the etching rate of the dielectric film 12' may be 60 nm/min in the first etching process, and the etching rate of the electrode layer may be 10 nm/min and the etching rate of the dielectric film 12' may be 40 nm/min in the second etching process.

As described above, the manufacturing method of the thin film capacitor according to the embodiment includes the first etching process of performing etching until the dielectric film 12' laminated just above one of the plurality of electrode layers (the internal electrode layer 11 or the base electrode layer 13) is exposed, and the second etching process of exposing one electrode layer, and the etching rate of the one electrode layer (the internal electrode layer 11 or the base electrode layer 13) is lower than the etching rate of the dielectric film 12' in the second etching process. Therefore, since the target electrode layer can be exposed under a condition that it is difficult for the electrode layer to be etched, excessive etching of one electrode layer which is in contact with the contact portion 44A and connected to the electrode terminal 20 via the first wiring layer 43A and the second wiring layer 43B can be suppressed. Thus, it is possible to suppress a decrease in strength of the electrode layer.

Further, the etching rate of one electrode layer in the second etching process is lower than the etching rate of the plurality of electrode layers in the first etching process. Therefore, since the target electrode layer can be exposed under a condition that the etching rate of the electrode layer is low, excessive etching of one electrode layer which is in contact with the contact portion 44A and connected to the electrode terminal 20 via the first wiring layer 43A and the second wiring layer 43B can be suppressed. Therefore, it is possible to suppress the strength of the electrode layer from being lowered.

Further, in the first etching process, since the laminated body W can be etched under a condition that the etching rate of the electrode layer is high, it is possible to suppress the electrode layer from being excessively etched while shortening a time required for manufacturing the thin film capacitor 1.

Further, one electrode layer (the internal electrode layer 11 or the base electrode layer 13) of the thin film capacitor 1 according to the embodiment has the exposed portion 15 exposed at the bottom surface of the opening 14, the thickness T1 of the exposed portion 15 being thinner than the thickness T2 of the other portions of the one electrode layer and being 50% or more of the thickness T2 of the other portions of the one electrode layer. That is, since an amount of the etched electrode layer is 50% or less of the thickness T2, the excessive etching of the electrode layer which is in contact with the contact portion 44A and connected to the electrode terminal 20 via the first wiring layer 43A and the second wiring layer 43B is suppressed. Accordingly, a decrease in the strength of the electrode layer is suppressed. Since the excessive etching of the electrode layer is suppressed and thus deterioration of electrical performance such as an increase in a resistance value of the thin film capacitor 1 is also curtailed, a yield for the thin film capacitors 1 is greatly improved.

Although the embodiment of the present invention has been described above, the present invention is not limited to the above-described embodiment, and various modifications can be made. For example, the case in which the capacitance portion 10 of the thin film capacitor 1 has two internal electrode layers 11, three dielectric layers 12, and one base electrode layer 13 has been described in the embodiment, but the number of layers of the internal electrode layer 11 and the dielectric layer 12 of the capacitance portion 10 is not particularly limited and can be arbitrarily changed. For example, the capacitance portion 10 may have one internal electrode layer 11, one dielectric layer 12, and one base electrode layer 13, or may have more internal electrode layers 11 and dielectric layers 12. Further, an insulating base material may be provided instead of the base electrode layer 13, and the internal electrode layers 11 and the dielectric layers 12 may be alternately laminated on the insulating base material.

Further, in the above-described embodiment, although the relative dielectric constant of the dielectric layer 12 is improved by baking the dielectric film 12', the dielectric layer 12 may not be baked.

Further, in the above-described embodiment, the example in which the etching rate of the electrode layer is lower than the etching rate of the dielectric film 12' in the second etching process has been described, but the etching rate of the electrode layer in the second etching process may be substantially the same as the etching rate of the dielectric film 12' or higher than the etching rate of the dielectric film 12'.

Further, in the above-described embodiment, the example in which the plurality of openings 14 (14A and 14B) are simultaneously formed in the first etching process and the second etching process has been described, but the first etching process and the second etching process may be repeated to form the openings 14 one by one.

What is claimed is:

1. A manufacturing method of a thin film capacitor comprising a capacitance portion in which at least one dielectric layer is sandwiched between a pair of electrode layers included in a plurality of electrode layers, the manufacturing method comprising:
    a lamination process of alternately laminating the plurality of electrode layers and a dielectric film which will be the dielectric layer thus forming a laminated body which will be the capacitance portion;
    a first etching process of etching an electrode layer above the dielectric film and a part of the dielectric film to form an opening extending in a laminating direction with respect to the laminated body and exposing the dielectric film laminated directly on one of the plurality of electrode layers on a bottom surface of the opening; and
    a second etching process of etching the exposed dielectric film and a part of the one electrode layer to expose the one electrode layer at the bottom surface of the opening,
    wherein an etching rate of the part of the one electrode layer is lower than an etching rate of the dielectric film in the second etching process, and
    wherein the etching rate of the one electrode layer in the second etching process is lower than the etching rate of the electrode layer in the first etching process.

2. The manufacturing method according to claim 1, wherein the second etching process is conducted so that a thickness of the exposed portion is smaller than a thickness of the other portions of the one electrode layer and is 50% or more of the thickness of the other portions of the one electrode layer.

3. The manufacturing method according to claim 1, wherein the etching rate in the first etching process is 30 nm/min to 600 nm/min, and the etching rate in the second etching process is 5 nm/min to 50 nm/min.

* * * * *